United States Patent
Saito et al.

(10) Patent No.: US 9,837,137 B2
(45) Date of Patent: Dec. 5, 2017

(54) SEMICONDUCTOR DEVICE

(71) Applicant: Micron Technology, Inc., Boise, ID (US)

(72) Inventors: Shunichi Saito, Kanagawa (JP); Toshio Sugano, Sagamihara (JP); Atsushi Hiraishi, Sagamihara (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/159,001

(22) Filed: May 19, 2016

(65) Prior Publication Data

US 2016/0267962 A1    Sep. 15, 2016

Related U.S. Application Data

(63) Continuation of application No. 14/508,744, filed on Oct. 7, 2014, now Pat. No. 9,368,185.

(30) Foreign Application Priority Data

Oct. 8, 2013   (JP) .................................. 2013-210966

(51) Int. Cl.
 *G11C 16/26* (2006.01)
 *G11C 11/406* (2006.01)
(52) U.S. Cl.
 CPC .. *G11C 11/40615* (2013.01); *G11C 11/40603* (2013.01); *G11C 16/26* (2013.01)
(58) Field of Classification Search
 CPC ............................... G11C 11/406; G11C 16/26
 USPC .............................................. 365/222, 189.05
 See application file for complete search history.

(56) References Cited

U.S. PATENT DOCUMENTS

| | | | | |
|---|---|---|---|---|
| 5,101,283 A | * | 3/1992 | Seki ................... | H04N 1/00411 358/3.03 |
| 5,113,248 A | * | 5/1992 | Hibi ..................... | H04N 1/6022 358/501 |
| 5,235,691 A | | 8/1993 | Hirosawa | |
| 6,215,714 B1 | * | 4/2001 | Takemae ........... | G11C 11/40622 365/222 |
| 6,317,657 B1 | * | 11/2001 | George ..................... | G06F 1/30 365/222 |
| 6,654,303 B2 | | 11/2003 | Miyamoto et al. | |
| 7,020,187 B1 | * | 3/2006 | Reid .................... | H04M 11/066 375/220 |

(Continued)

FOREIGN PATENT DOCUMENTS

JP   2002358781 A   12/2002
JP   2008146687 A    6/2008

*Primary Examiner* — Michael Tran
(74) *Attorney, Agent, or Firm* — Schwegman Lundberg & Woessner, P.A.

(57) ABSTRACT

A semiconductor device includes a plurality of memory cells, an access circuit configured to perform a data read operation, a data write operation and a data refresh operation on the memory cells, the access circuit to operate in a selected one of a first mode that is ready to perform and a second mode that is not ready to perform, and a judgment circuit configured to respond to first command information, to cause, when the access circuit is in the first mode, the access circuit to perform the data refresh operation, and to cause, when the access circuit is in the second mode, the access circuit to exit from the second mode and then to perform the refresh operation.

20 Claims, 12 Drawing Sheets

(56) References Cited

U.S. PATENT DOCUMENTS

| | | | |
|---|---|---|---|
| 7,142,003 B2* | 11/2006 | Kanbayashi | G01R 31/31928 324/73.1 |
| 7,237,159 B2* | 6/2007 | Yatsuka | G01R 31/319 714/724 |
| 7,359,994 B1* | 4/2008 | Lakhanpal | H04L 43/18 702/108 |
| 7,385,858 B2 | 6/2008 | Oh | |
| 7,453,928 B2* | 11/2008 | Ten | H04L 25/028 341/144 |
| 7,558,908 B2 | 7/2009 | Bellows et al. | |
| 7,685,407 B2* | 3/2010 | Sakamaki | G06F 13/4013 710/3 |
| 7,719,916 B2* | 5/2010 | Chun | G11C 11/406 365/222 |
| 7,742,356 B2 | 6/2010 | Dono et al. | |
| 7,764,560 B2 | 7/2010 | Sato et al. | |
| 7,818,464 B2* | 10/2010 | Pyeon | G11C 5/066 365/230.06 |
| 7,929,369 B2 | 4/2011 | Lee et al. | |
| 8,027,216 B2 | 9/2011 | Fukuda et al. | |
| 8,054,707 B2 | 11/2011 | Ware | |
| 8,174,915 B2* | 5/2012 | Yamamoto | G11C 8/18 365/201 |
| 8,760,945 B2* | 6/2014 | Jeon | G11C 8/18 365/189.07 |
| 8,854,910 B2* | 10/2014 | Park | G11C 11/40615 365/222 |
| 8,971,117 B2* | 3/2015 | Tanzawa | G11C 11/5621 365/185.17 |
| 9,385,611 B2* | 7/2016 | DeHaven | H02M 3/285 |
| 2003/0067824 A1* | 4/2003 | Janzen | G11C 7/1066 365/222 |
| 2003/0193829 A1* | 10/2003 | Morgan | G11C 5/14 365/222 |
| 2005/0265103 A1* | 12/2005 | Remaklus | G11C 11/40611 365/222 |
| 2006/0233012 A1* | 10/2006 | Sekiguchi | G11C 5/02 365/51 |
| 2007/0033339 A1* | 2/2007 | Best | G11C 11/406 711/106 |
| 2007/0140315 A1* | 6/2007 | Janzen | G01K 7/00 374/170 |
| 2007/0242547 A1* | 10/2007 | Ahn | G11C 7/20 365/222 |
| 2008/0049532 A1* | 2/2008 | Kajigaya | G11C 8/12 365/222 |
| 2008/0056045 A1* | 3/2008 | Proell | G11C 7/12 365/222 |
| 2008/0291765 A1* | 11/2008 | Smith | G06F 5/02 365/222 |
| 2009/0067277 A1* | 3/2009 | Smith | G11C 7/1066 365/230.06 |
| 2009/0279373 A1* | 11/2009 | Han | G11C 11/406 365/222 |
| 2010/0238695 A1 | 9/2010 | Ono | |
| 2012/0182778 A1* | 7/2012 | Sato | G11C 5/02 365/63 |
| 2013/0282973 A1* | 10/2013 | Kim | G11C 11/40622 711/106 |
| 2014/0064009 A1* | 3/2014 | Lee | G11C 11/40611 365/222 |
| 2015/0098289 A1 | 4/2015 | Saito et al. | |

* cited by examiner

SEMICONDUCTOR DEVICE

RELATED APPLICATION

This application is a continuation of U.S. application Ser. No. 14/508,744, filed Oct. 7, 2014, which is based upon and claims the benefit of priority from Japanese Patent Application No. 2013-210966 filed on Oct. 8, 2013, the disclosure of which are incorporated herein by reference in their entirety.

BACKGROUND

Some semiconductor devices, such as dynamic random access memories (DRAMs), operate based on the receipt of commands.

BRIEF DESCRIPTION OF THE DRAWINGS

The features and advantages of the various embodiments will be more apparent from the following detailed description, taken in conjunction with the accompanying drawings, in which:

FIG. 2 is a block diagram of a judgment circuit 43a.

DETAILED DESCRIPTION

In some embodiments a plurality of semiconductor devices, such as DRAMs, may be mounted on a module substrate or the like to configure one or two or more ranks. The rank means refers to a group of units that can be accessed at the same time. Thus, common commands from a controller are input to a plurality of semiconductor devices configured in the same rank.

Therefore, in some embodiments, a plurality of semiconductor devices configured in the same rank may output read data in parallel in a read operation, and may receive write data in parallel in a write operation. Switching of operation modes may be commonly executed for the plurality of semiconductor devices configured in the same rank. As to the operation modes, in addition to a normal mode, readers that desire to learn more may refer to Japanese Patent Application Laid Open No. 2002-358781 that shows a deep power down mode, and Japanese Patent Application Laid Open No. 2008-146687 that shows a self-refresh mode, each of which is incorporated herein in its entirety by reference.

In some embodiments, a function called per DRAM addressability that can independently input commands to a plurality of DRAMs configured in the same rank may be applied.

A DRAM having the per DRAM addressability function, on the basis of a selection signal input from a data input/output terminal in synchronization with a command, may select whether or not to receive the command With the use of the DRAMs each having the per DRAM addressability function, only some DRAMs configured in the same rank can be entered into, for example, the deep power down mode. That is, the function may allow dynamically changing bus widths and switching availability/unavailability of an ECC (Error Correction Code).

However, when only some DRAMs configured in the same rank are entered into a predetermined operation mode, access to other DRAMs may not be executed for a period required for a return from the predetermined operation mode to the normal mode. For example, when only some DRAMs configured in the same rank enter into the deep power down mode, for the period required for a return from the deep power down mode to the normal mode, a refresh command might not be input to other DRAMs. Since a relatively long time is required to return from the deep power down mode, there might be a risk that a refresh command cannot be issued for other DRAMs within a maximum issue cycle of a refresh command regulated by the specifications.

Figure 1:
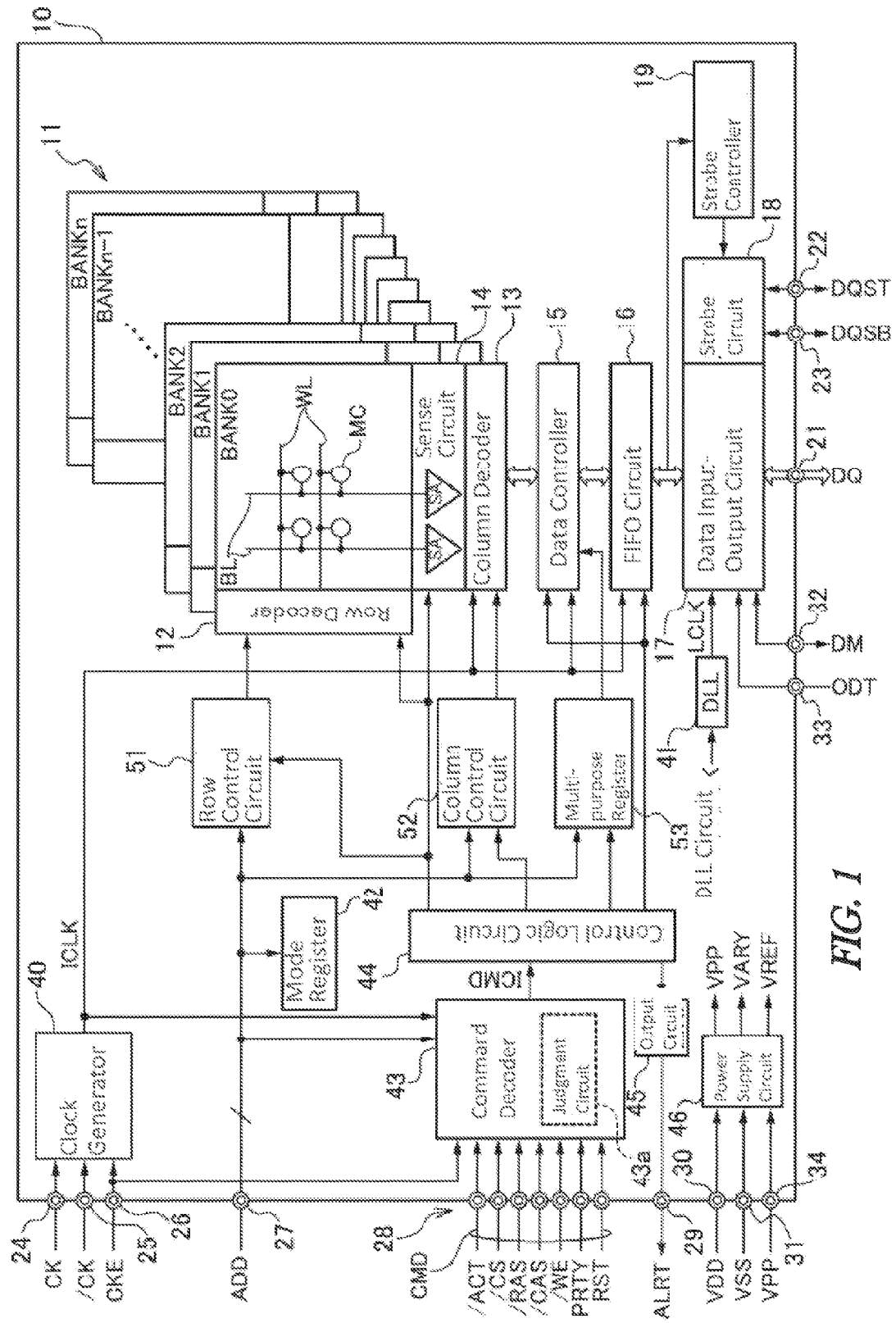
FIG. 1 is a block diagram showing an entire structure of a semiconductor device 10 according to various embodiments.

FIG. 1 is a block diagram showing an entire structure of a semiconductor device 10 according to various embodiments.

The semiconductor device 10 may be DRAMs integrated in one semiconductor chip, and, as shown in FIG. 1, may include a memory cell array 11 divided into n+1 banks. The banks are units that can independently execute commands, and can basically perform nonexclusive operations.

In some embodiments, in the memory cell array 11, a plurality of word lines WL and a plurality of bit lines BL cross each other, and memory cells MC are arranged at nodes between the word lines WL and the bit lines BL, respectively. Selection of the word lines WL is performed by a row decoder 12, and selection of the bit lines BL is performed by a column decoder 13. The bit lines BL are connected to corresponding sense amplifiers SA in a sense circuit 14, respectively, and the bit line BL selected by the column decoder 13 is connected to a data controller 15 through the sense amplifier SA. The data controller 15 is connected to a data input-output circuit 17 through an FIFO circuit 16. The data input-output circuit 17 is a circuit block that inputs/outputs data through a data input-output terminal 21.

The semiconductor device 10 has, in addition to the data input-output terminal 21, as external terminals, strobe terminals 22 and 23, clock terminals 24 and 25, a clock enable terminal 26, an address terminal 27, a command terminal 28, an alert terminal 29, a power supply terminals 30, 31 and 34, a data mask terminal 32, and an ODT terminal 33.

The strobe terminals 22 and 23 are terminals to input/output external strobe signals DQST and DQSB. The external strobe signals DQST and DQSB are complementary signals that regulate input/output timing of data input/output through the data input-output terminal 21. In some embodiments, when data is input, for example in a write operation, the external strobe signals DQST and DQSB are supplied to a strobe circuit 18, and the strobe circuit 18 controls an operation timing of the data input-output circuit 17 on the basis of the external strobe signals DQST and DQSB. In this manner, the write data input through the data input-output terminal 21 is taken into the data input-output circuit 17 in synchronization with the external strobe signals DQST and DQSB. On the other hand, in some embodiments, when data is output, for example in a read operation, a strobe controller 19 controls the operation of the strobe circuit 18. In this manner, the data input-output circuit 17 outputs read data in synchronization with the external strobe signals DQST and DQSB.

The clock terminals 24 and 25 receive external clock signals CK and /CK. The received external clock signals CK and /CK are supplied to a clock generator 40. In this disclosure, a signal having a signal name in which a symbol "/" (forward slash) given in front of it means a low active signal or an inverted signal of the corresponding signal. Thus, the external clock signals CK and /CK are complementary to each other. The clock generator 40 is activated on the basis of a clock enable signal CKE input through the clock enable terminal 26 to generate an internal clock signal ICLK. The external clock signals CK and /CK supplied through the clock terminals 24 and 25 are also supplied to a DLL circuit 41. The DLL circuit 41 generates an output clock signal LCLK controlled in phase on the basis of the external clock signals CK and /CK. The output clock signal LCLK is used as a timing signal that regulates an output timing of read data output by the data input-output circuit 17.

The address terminal 27 receives an address signal ADD. The supplied address signal ADD is supplied to a row control circuit 51, a column control circuit 52, a mode register 42, a command decoder 43, a multi-purpose register 53, and the like. The row control circuit 51 is a circuit block including an address buffer, a refresh counter, and the like, and controls the row decoder 12 on the basis of a row address. The column control circuit 52 is a circuit block including an address buffer, a burst counter, and the like, and controls the column decoder 13 on the basis of the column address. When the semiconductor device enters into a mode register set configuration, the address signal ADD is supplied to the mode register 42, and the contents of the mode register 42 are updated.

The command terminal 28 receives a chip select signal /CS, an act signal /ACT, a row address strobe signal /RAS, a column address strobe signal /CAS, a write enable signal /WE, a parity signal PRTY, a reset signal RST, and the like. These command signals CMD are supplied to the command decoder 43. The command decoder 43 generates an internal command ICMD on the basis of the command signals CMD and the clock enable signal CKE. The internal command signal ICMD is supplied to a control logic circuit 44. The control logic circuit 44, on the basis of the internal command signal ICMD, controls the operations of the row control circuit 51, the column control circuit 52, the data controller 15, the multi-purpose register 53, and the like.

Figure 2:
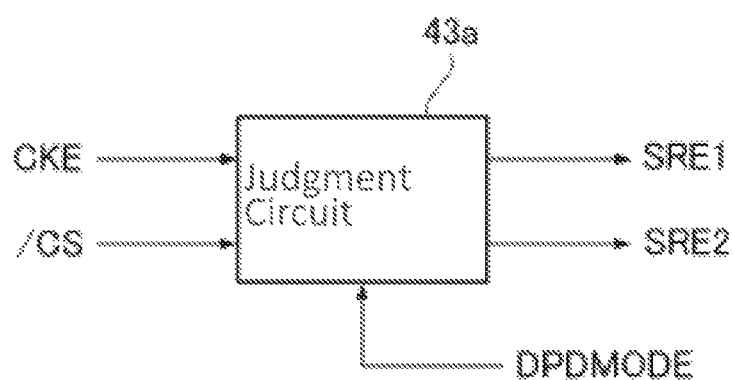

The command decoder 43 includes a judgment circuit 43a. The judgment circuit 43a, as shown in FIG. 2, receives the clock enable signal CKE and the chip select signal /CS to determine an entry to a self-refresh mode. The self-refresh mode is a type of standby mode, and is an operation mode that automatically executes a refresh operation on the memory cell array 11 under the control of the row control circuit 51. When the semiconductor device enters into the self-refresh mode, although the data in the memory cell array 11 is held, the semiconductor device will not accept an external access. Since most of the circuit blocks are inactivated, current consumption may become very low. Readers that desire to learn more about the self-refresh mode or command may refer to U.S. Pat. No. 7,742,356 (which is a counterpart application of JP2008-146687). The disclosure of U.S. Pat. No. 7,742,356 is incorporated herein by reference thereto in its entirety. The circuits, such as the command decoder 43, the control logic circuit 44, the row control circuit 51, the column control circuit 52, the data input-output circuit 17, the FIFO circuit 16, the data controller 15, or the row and column decoders 12 and 13, can be referred to as access circuits.

For the semiconductor device 10 according to some embodiments, two commands are prepared as commands for entry to the self-refresh mode. One of the commands is a first self-refresh entry command SRE1, and the other one is a second self-refresh entry command SRE2. Both of the commands are expressed by combinations of the clock enable signal CKE and the chip select signal /CS. The judgment circuit 43a determines whether the self-refresh entry command is the first self-refresh entry command SRE1 or the second self-refresh entry command SRE2, depending on a present operation mode and change patterns of the clock enable signal CKE and the chip select signal /CS. The details about this determination will be described later.

In some embodiments, the command decoder 43 may include a verification circuit (not shown in the drawings). The verification circuit verifies the address signal ADD and the command signal CMD on the basis of the parity signal PRTY. As a result, when the address signal ADD or the command signal CMD includes an error, an alert signal ALRT will be output through the control logic circuit 44 and the output circuit 45. The alert signal ALRT is output to the outside through an alert terminal 29. The information of the error (i.e., a CA parity error status) is stored in the multi-purpose register 53, and the stored information is output as the alert signal ALRT.

The power supply terminals 30, 31 and 34 receive power supply potential voltages or power source voltage VDD, VSS, and VPP respectively. The power supply potential voltages VDD, VSS and VPP supplied through the power supply terminals 30, 31 and 34 are supplied to a power supply circuit 46. The power supply circuit 46 may include a circuit block that generates various internal potential voltages or internal power source voltages on the basis of the power supply potentials VDD, VSS and VPP. The internal potential voltages generated by the power supply circuit 46 may include an array potential VARY, a reference potential VREF, and the like. The array potential VARY and the reference potential VREF are generated by reducing the external potential VDD.

The external potential VPP may be a potential voltage used in the row decoder 12. The row decoder 12 may drive the word line WL selected on the basis of the address signal ADD to a VPP level so as to energize cell transistors included in the memory cell MC. The internal potential voltage VARY may be used in the sense circuit 14. When the sense circuit 14 is activated, one of a pair of bit lines is driven to a VARY level and the other one of the pair of bit lines may be driven to a VSS level to amplify read data that is read out. The external potential voltage VDD may be used as an operating potential in most of the peripheral circuits (such as the row control circuit 51 and the column control circuit 52). The reference potential voltage VREF may be a potential used in the data input-output circuit 17.

The data mask terminal 32 and the ODT terminal 33 receive a data mask signal DM and a terminating signal ODT, respectively. The data mask signal DM and the terminating signal ODT are supplied to the data input-output circuit 17. The data mask signal DM will be activated when some of write data is masked, and the terminating signal ODT will be activated when the output buffer included in the data input-output circuit 17 is used as a terminating register. The data mask terminal 32 is also used as a DBI terminal. For example, when the value of the terminal 32 is at a low level, after data is inverted in the semiconductor device 10, the inverted data will be written in a memory cell array or output from the semiconductor device 10. When the value of the terminal 32 is at a high level, without inverting data in the semiconductor device 10, the non-inverted data will be written in the memory cell array or output from the semiconductor device 10. The mode register 42 designates whether the terminal 32 is going to be used as the data mask terminal or the DBI terminal.

The command decoder 43 receives commands, in addition to the self-refresh entry commands SRE1 and SRE2, a refresh command REF, a self-refresh exit command SRX, a deep power down entry command DPD, and the like.

The refresh command REF will be input when a refresh operation is executed, and will be periodically input in a normal mode. The self-refresh exit command SRX is a command to return the semiconductor device 10 in the self-refresh mode to the normal mode. The deep power down entry command DPD is a command to enter the semiconductor device 10 into the deep power down mode. The deep power down mode is a kind of standby mode that may inactivate most of the circuit blocks including the power supply circuit 46 configuring the semiconductor device 10, and the self-refresh operation is also not executed. A circuit for returning the semiconductor device 10 from the deep power down mode to the normal mode is still activated in the deep power down mode, such that the returning circuit can detect a deep power down mode exit command input from the outside. For this reason, the data in the memory cell array 11 is reduced or even eliminated, and a current consumption is further reduced in comparison with the self-refresh mode. Since the mode can easily be set by storing the value into the mode register 42 and the like, returning the semiconductor device 10 from the deep power down mode may be performed at a speed higher than that of an initializing operation performed when the reset signal RST is input.

The semiconductor 10 according to various embodiments may include a so-called "per DRAM addressability function." The per DRAM addressability function may be a function that inputs a selection signal to the data input-output terminal 21 in synchronization with the command signal CMD to make it possible to select whether or not to accept the command signal CMD. In some embodiments, when a low-level selection signal is input to the data input-output terminal 21, a command input in synchronization with the selection signal will be valid for the corresponding DRAM or memory unit. In contrast, when a high-level selection signal is input to the data input-output terminal 21, a command input in synchronization with the selection signal will be invalid for the corresponding DRAM.

Figure 3:
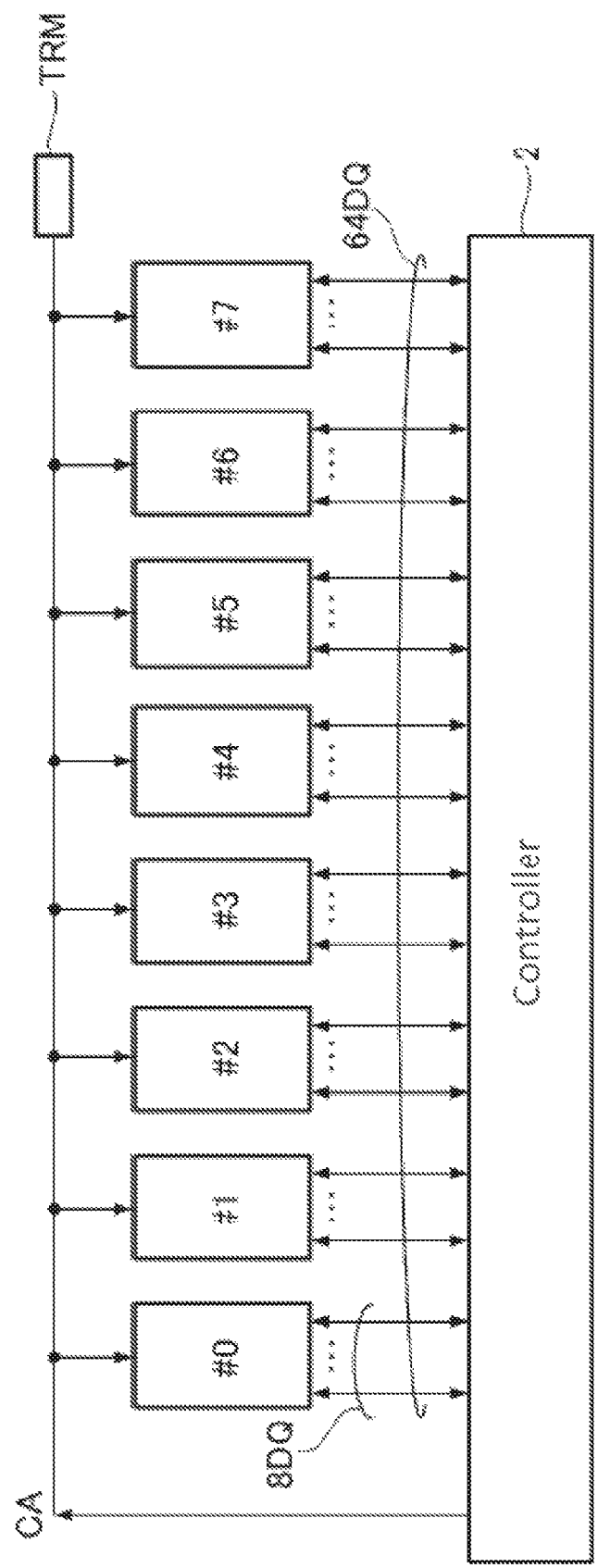
FIG. 3 is a block diagram of a data processing system including eight DRAMs #0 to #7, and shows a case in which all the DRAMs #0 to #7 are set in a normal mode.

The per DRAM addressability function may allow a plurality of DRAMs belonging to the same rank to be independently controlled. For example, in a data processing system as shown in FIG. 3, when eight DRAMs #0 to #7 are used to configure one rank, command/address signals CA (such as a clock signal, a chip select signal, an address signal, and a command signal supplied from the controller 2) will be commonly input to the eight DRAMs #0 to #7. Readers that desire to learn more about rank configurations may refer to e.g., FIG. 9 of U.S. Patent application No. US2010/0238695, the entire document of which is incorporated herein by reference in its entirety. At least for this reason, in general, the eight DRAMs #0 to #7 may perform read/write operations in parallel with each other. In this case, when one DRAM has 8 (=8DQ) data input/output terminals, one rank has a 64-bit (=64DQ) data width. It is noted that DRAMs of different ranks receive respective different chip select signals.

According to the normal system, data width may be dynamically changed. However, the per DRAM addressability function may enable the four DRAMs #4 to #7 to be selectively entered into the deep power down mode. Therefore only the remaining four DRAMs #0 to #3 may be operated in the normal mode. In this manner, the data width may be switched from 64 bits to 32 bits (=32DQ). The selective entry to the deep power down mode may be executed, such that the deep power down entry command may be issued from the controller 2 to the DRAMs #0 to #7 in a state in which high-level selection signals are input to the data input/output terminals 21 of the DRAMs #0 to #3 and low-level selection signals are input to the data input/output terminals 21 of the DRAMs #4 to #7. The command address signal CA may be terminated by the terminating register TRM.

Figure 5:
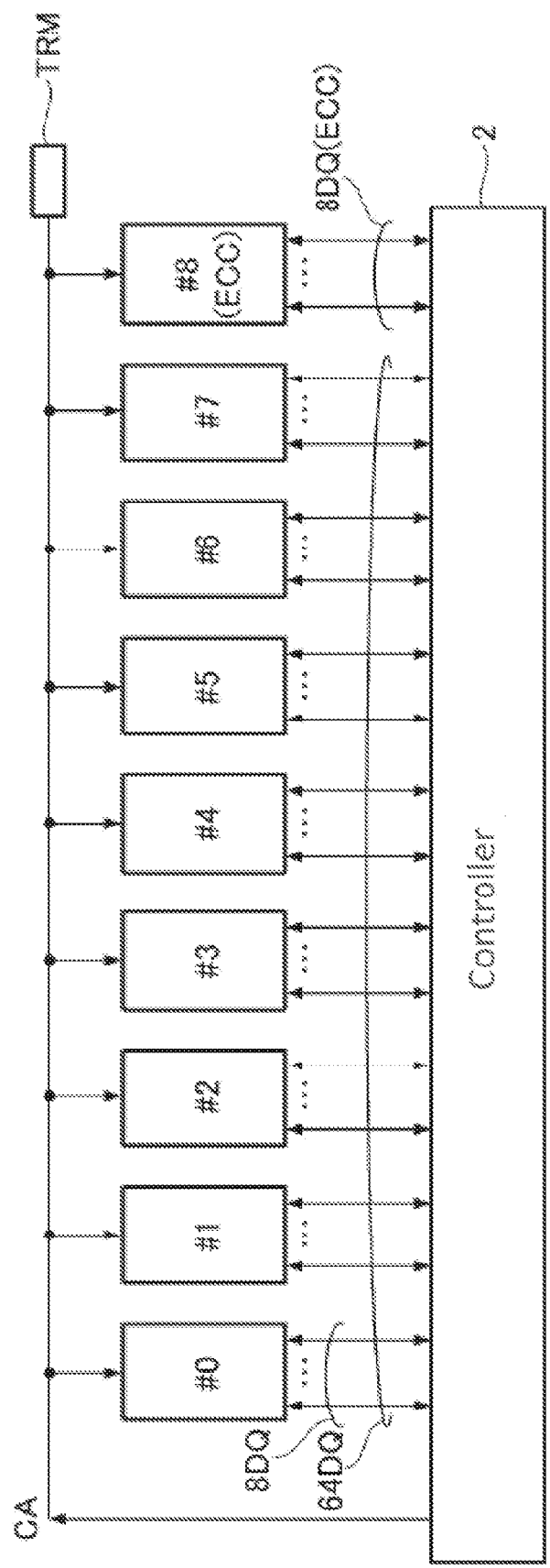
FIG. 5 is a block diagram of a data processing system including nine DRAMs #0 to #8, and shows a case in which an ECC is used.
Figure 6:
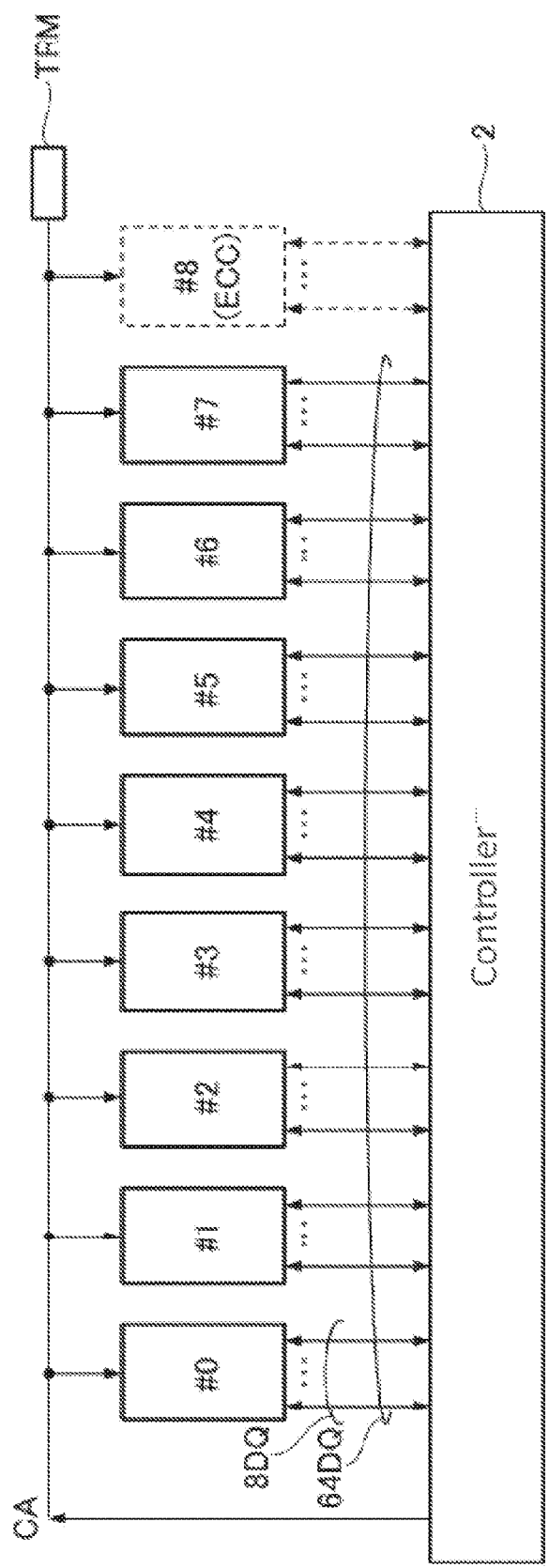
FIG. 6 is a block diagram of a data processing system including nine DRAMs #0 to #8, and shows a case in which no ECC is used.

Alternatively, in some embodiments as shown in FIG. 5, in a system, nine DRAMs #0 to #8 are used to configure one rank, the eight DRAMs #0 to #7 of the nine DRAMs are assigned to the user data, and one DRAM #8 is assigned to an ECC. In this system, as shown in FIG. 6, only the DRAM #8 can be entered into the deep power down mode. According to this, it may be dynamically switched whether or not to use the ECC.

Figure 7:
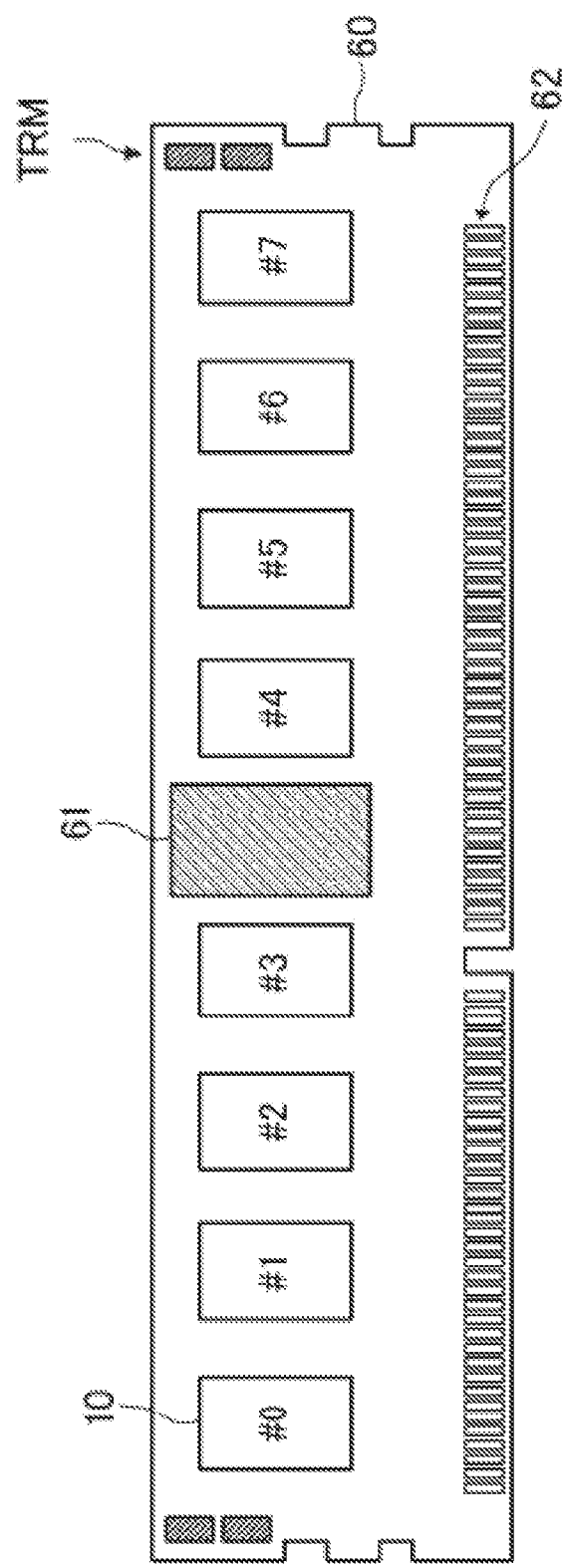
FIG. 7 is a schematic diagram showing an embodiment in which eight DRAMs #0 to #7 are mounted on a module substrate 60.
Figure 8:
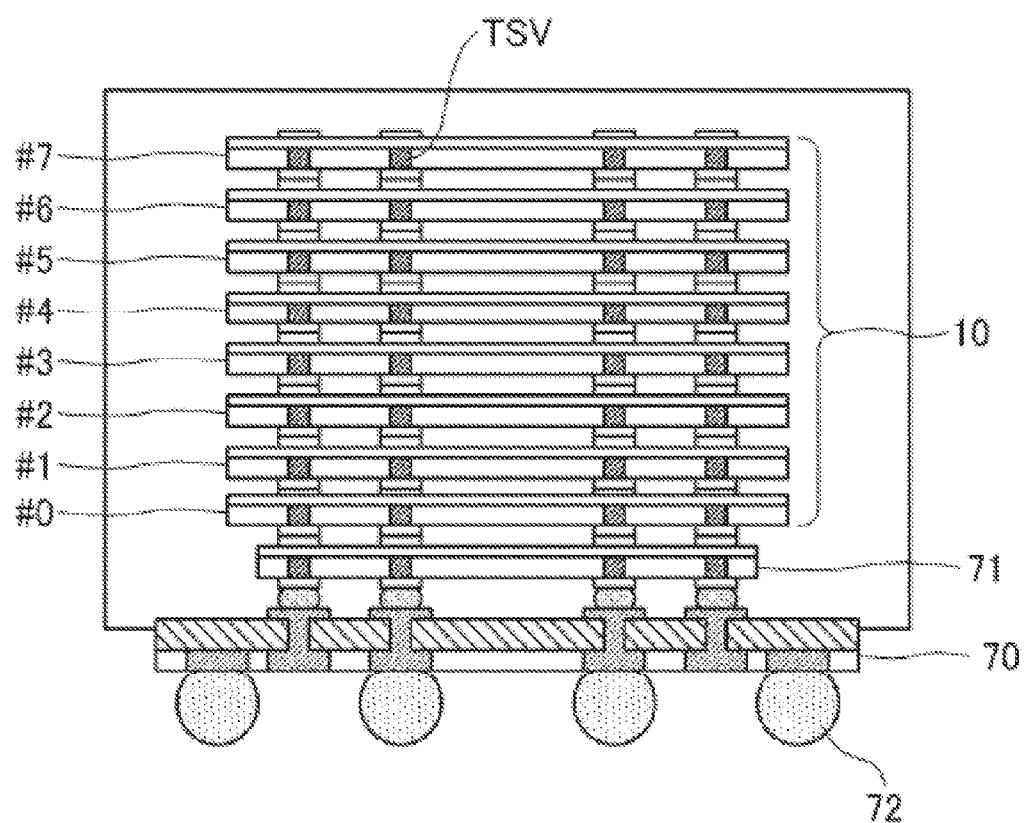
FIG. 8 is a schematic diagram showing an embodiment in which eight DRAMs #0 to #7 are stacked on a package substrate 70.

When the eight DRAMs #0 to #7 are used to constitute one rank, as shown in FIG. 7, the eight DRAMs #0 to #7 may be mounted on the module substrate 60, or as shown in FIG. 8, the eight DRAMs #0 to #7 may be stacked on the package substrate 70.

In some embodiments as shown in FIG. 7, the DRAMs #0 to #7 are arranged in a line along the long side of the module substrate 60, and a register buffer 61 is arranged between the DRAM #3 and the DRAM #4. The register buffer 61 serves to buffer the command/address signal CA and the write data DQ supplied from a connector 62 to supply the signal and the data to the DRAMs #0 to #7, and to buffer the read data DQ output from the DARMs #0 to #7 to supply the data to the connector 62. The terminating register TRM is also mounted on the module substrate 60.

In some embodiments as shown in FIG. 8, the control chip 71 and the DRAMs #0 to #7 are three-dimensionally stacked on the package substrate 70, and the chips are connected to each other through electrodes TSV. With this configuration, the command/address signal CA and the write data DQ supplied to an external terminal 72 are supplied to the DRAMs #0 to #7 through the control chip 71, and the read data DQ output from the DRAMs #0 to #7 are supplied to the external terminal 72 through the control chip 71.

As described with reference to FIGS. 3 to 6, by using the per DRAM addressability function, DRAMs in the rank can be selectively entered into the deep power down mode. However, when one DRAM entering into the deep power down mode is returned to the normal mode, data of another DRAM operated in the normal mode may be disadvantageously reduced or even eliminated depending on a time required for the returning.

Figure 9:
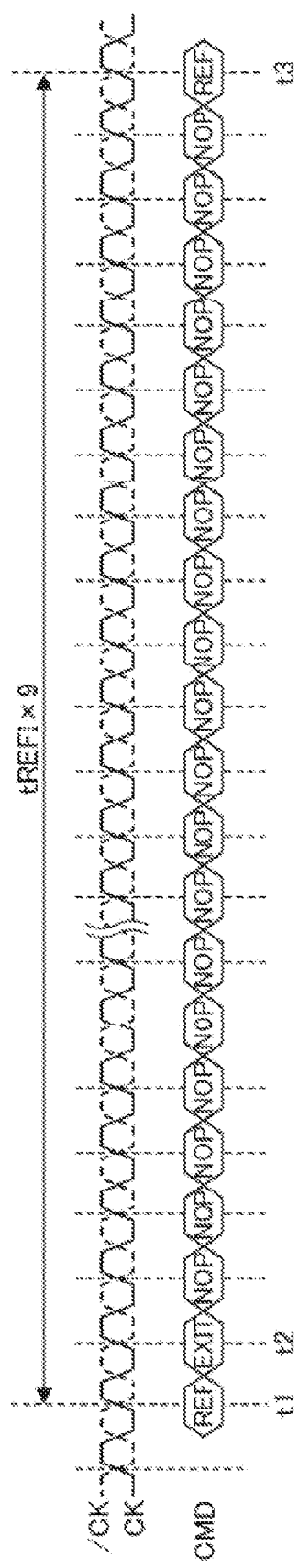
FIG. 9 is a timing chart for explaining a manner of issuing refresh commands at a maximum cycle regulated by specifications.

FIG. 9 is a timing chart for explaining a manner of issuing refresh commands at the maximum cycle regulated by the specifications.

In some embodiments as shown in FIG. 9, a refresh command REF is issued at time t1. It is regulated by the specifications that the next refresh command REF is issued within a period of time, from t1 to time t3, at which tREFI×9 time passes. The tREFI is an oscillator cycle in the self-refresh mode, and may be about 7.8 μs (microseconds) in duration, for example.

Figure 4:
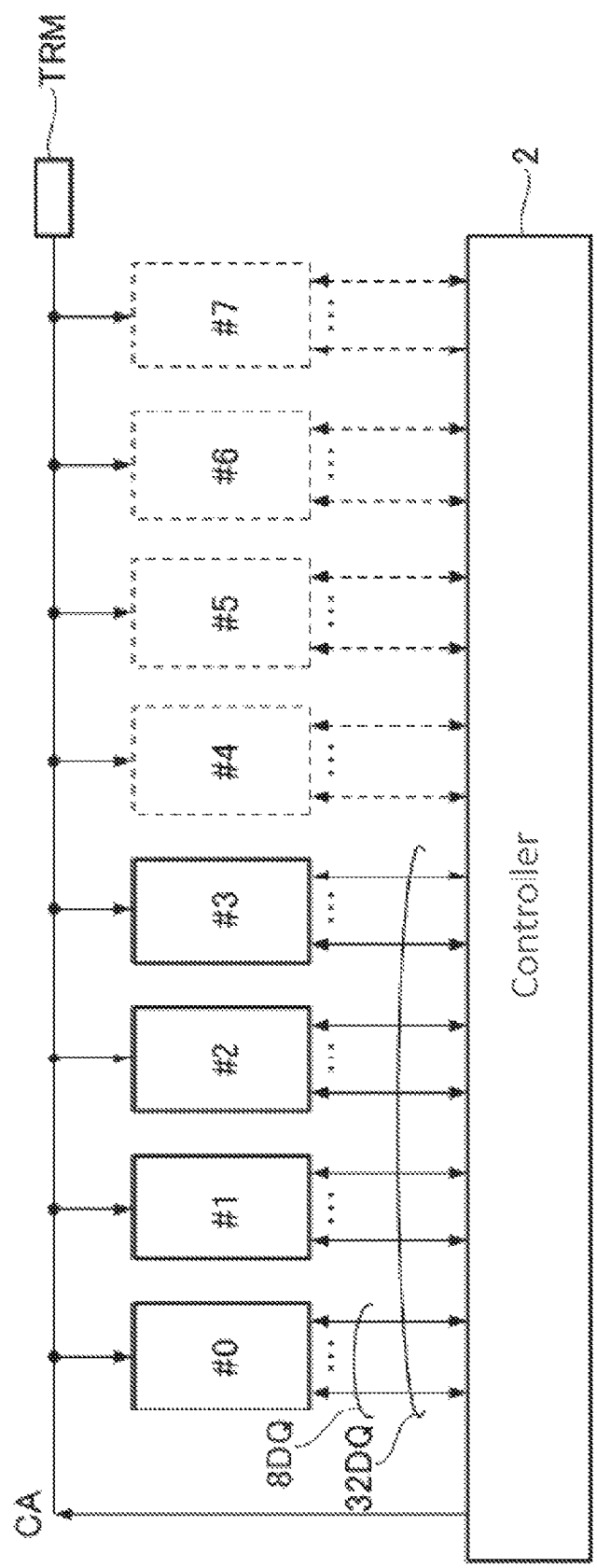
FIG. 4 is a block diagram of a data processing system including eight DRAMs #0 to #7, and shows a case in which the DRAMs #0 to #3 are set in the normal mode, and the DRAMs #4 to #7 have entered into the deep power down mode.

In some embodiments, as shown in FIG. 4, the DRAMs #0 to #3 may operate in the normal mode, and the DRAMs #4 to #7 may enter into the deep power down mode. In this case, the refresh command REF may be input or issued to the DRAMs #0 to #3 at time t1, and, at time t2 immediately after time t1, an exit command EXIT may be input or issued for returning the DRAMs #4 to #7 from the deep power down mode to the normal mode. In this case, because the DRAMs #0 to #3 operate in the normal mode, the data in the DRAMs #0 to #3 can be retained. Thus, the next refresh command REF may be issued at time t3 at which tREFI×9 time passes.

However, in this case, since the exit command EXIT is issued at time t2, returning operations from the deep power down mode are started with respect to the DRAMs #4 to #7. When a long time (for example, about several hundred μs), longer in time than tREFI×9 (the maximum issue cycle time), is experienced, until the DRAMs return from the deep power down mode into the normal mode, in the middle of the returning operations from the deep power down mode with respect to the DRAMs #4 to #7, the refresh command REF may be consequently input by time t3 at the latest. The refresh command REF input during the returning operation may be an invalid command, and the DRAMs #4 to #7 may erroneously operate.

The problems described above may be solved by two types of self-refresh entry commands SRE1 and SRE2 prepared for the semiconductor device 10 according to some embodiments. The two types of self-refresh entry commands SRE1 and SRE2 will be described below in detail.

Figure 10:
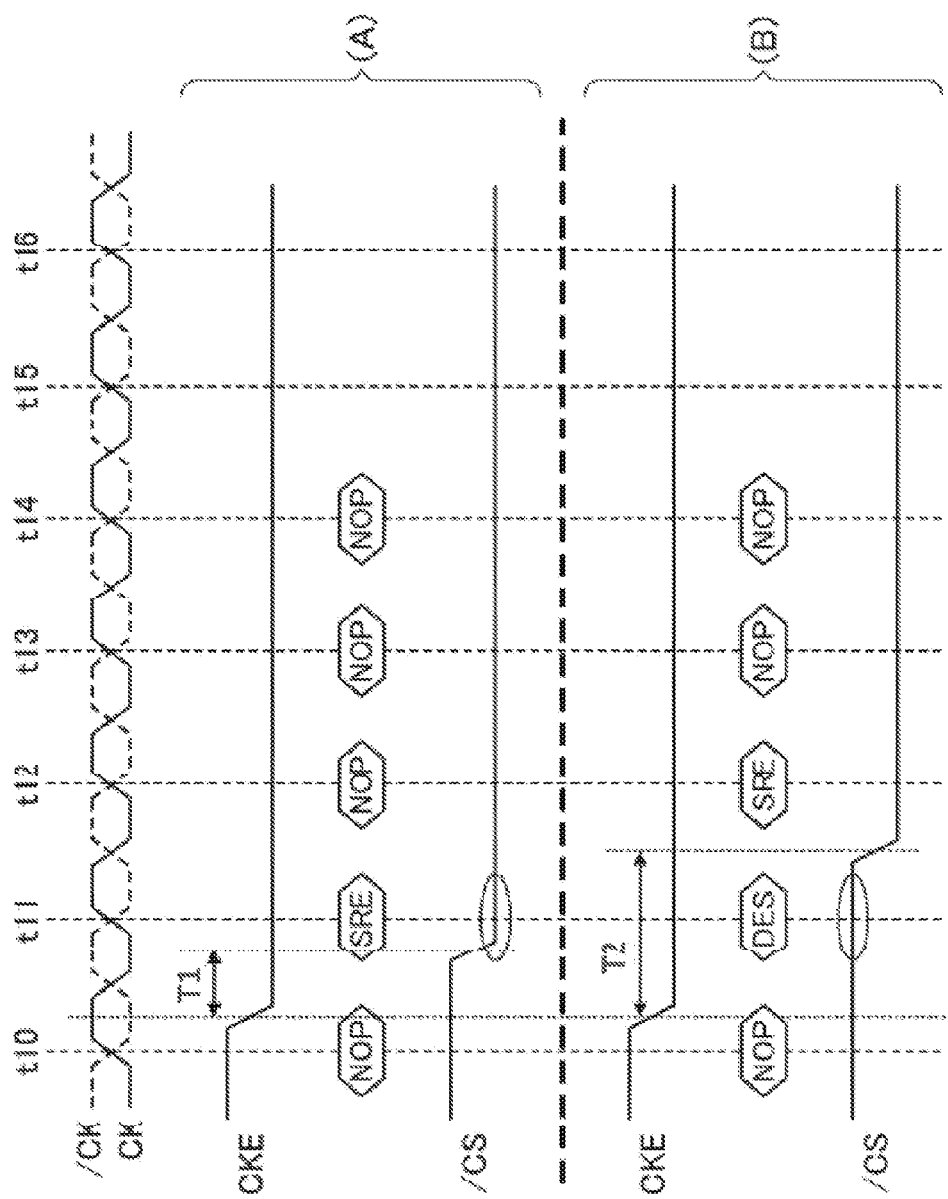
FIG. 10 is a waveform chart obtained when the self-refresh entry command is issued, and shows a first input pattern (A) and a second input pattern (B).

FIG. 10 is a waveform chart obtained when a self-refresh entry command is issued, and shows a first input pattern (A) and a second input pattern (B).

As shown in FIG. 10, each of the first input pattern (A) and the second input pattern (B) has a waveform in which the clock enable signal CKE transitions from an active level to an inactive level and, thereafter, the chip select signal /CS transitions from an inactive level to an active level. A difference between the waveforms is a time span from a time when the clock enable signal CKE changes to another time when the chip select signal /CS changes.

In some embodiments, in the first input pattern (A), the time span from a time when the clock enable signal CKE changes to another time when the chip select signal /CS changes is T1. On the other hand, in the second input pattern (B), the time span from a time when the clock enable signal CKE changes to another time when the chip select signal /CS changes is T2 (<T1).

In this case, since a command is determined at a rising edge of the clock signal CK (falling edge of the clock signal /CS), when the first input pattern (A) is input, CKE=L and /CS=L should be satisfied at time t11 as shown in FIG. 10 and CKE=L and /CS=L should be satisfied at time t12 as shown in FIG. 10. On the other hand, when the second input pattern (B) is input, CKE=L and /CS=H should be satisfied at time t11. In each of the input patterns, CKE=H and /CS=H are satisfied at time t10 in the previous cycle. Since the semiconductor device 10 that enters into the deep power down mode does not receive the clock signals CK and /CK, the semiconductor device 10 is not in synchronization with the clock signals.

Figures 11, 12:
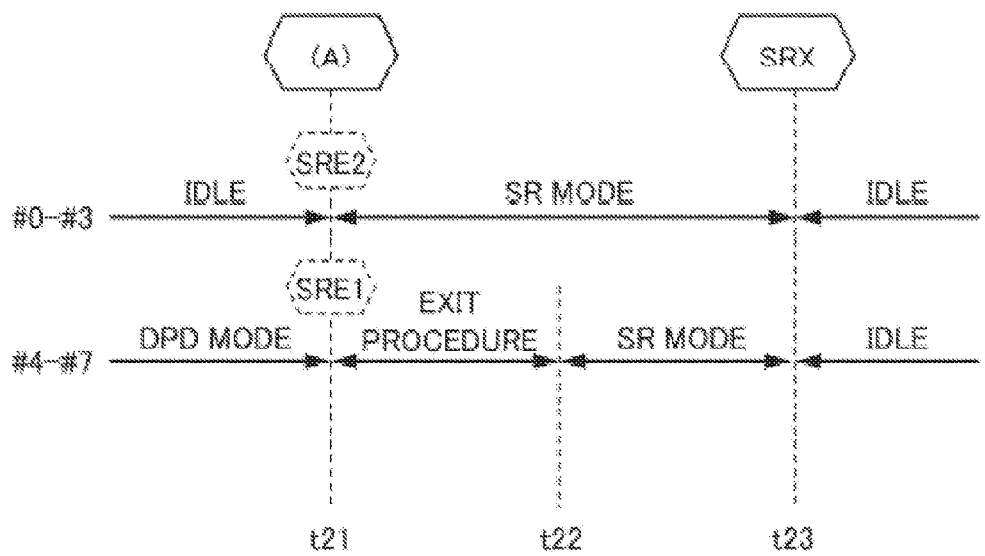
FIG. 11 is a table explaining relationships between a present operation mode and the first and second input patterns (A) and (B).
FIG. 12 is a timing chart explaining an operation performed when a command signal CMD having the first input pattern (A) as shown in FIG. 10 is input, in case that DRAMs are operated in different operation modes.

FIG. 11 is a table explaining relationships between a present operation mode and the first and second input patterns (A) and (B).

As shown in FIG. 11, during operation in the normal mode (i.e., in an IDLE state, that is, a mode is ready to perform), when any one of the first input pattern (A) and the second input pattern (B) appears, the judgment circuit 43a included in the command decoder 43 will interpret the command signal CMD as the second self-refresh entry command SRE2. In contrast, when the semiconductor device 10 enters into the deep power down mode (that is, a mode that is not ready to perform), the command signal CMD will be interpreted as the first self-refresh entry command SRE1 when the first input pattern (A) appears, and the command signal CMD will be interpreted as a no-operation command NOP when the second input pattern (B) appears. In this manner, even though the command does not change, the command can be interpreted as different commands depending on the operation mode present when the command is asserted.

In a normal DRAM, a state in which CKE=L and /CS=L are satisfied is interpreted as the self-refresh entry command SRE. The DRAM enters into the self-refresh mode. In the normal DRAM, a state in which /CS=H is satisfied is interpreted as a device deselect DES, the other command signal CMD at the timing is neglected.

However, in some embodiments, when the first input pattern (A) appears in a state in which the semiconductor device enters into the deep power down mode, the state will be interpreted as the first self-refresh entry command SRE1. As will be described later, an operation different from that in the second self-refresh entry command SRE2 may be performed. The second self-refresh entry command SRE2 may be basically the same as a self-refresh entry command SRE in a normal DRAM.

FIG. 12 is a timing chart explaining an operation performed when the command signal CMD having the first input pattern (A) as shown in FIG. 10 is input when DRAMs having different operation modes are mixed.

In some embodiments as shown in FIG. 12, the DRAMs #0 to #3 operate in the normal mode (IDLE), and the DRAMs #4 to #7 have entered into the deep power down mode (DPD MODE). In this state, a command having the first input pattern (A) is issued as time t21. As described above, the first input pattern (A) may be interpreted as the second self-refresh entry command SRE2 in each of the DRAMs #0 to #3 in an IDLE state, and the first input pattern (A) may be interpreted as the first self-refresh entry command SRE1 in each of the DRAMs #4 to #7 in the deep power down mode.

Thus, the DRAMs #0 to #3 in the IDLE state may enter into the self-refresh mode (SR MODE) at time t21. On the other hand, the DRAMs #4 to #7 may perform a returning operation (EXIT PROCEDURE) from the deep power down mode and may automatically enter into the self-refresh mode (SR MODE) at time t22 after the returning operation is completed. The operation may be performed by the control logic circuit 44 and the row control circuit 51 in response to activation of the internal command SRE2 output from the judgment circuit 43a as shown in FIG. 2. In some embodiments, an entry into the self-refresh mode may be automatically performed by the control logic circuit 44 and the row control circuit 51 regardless of a command issued from the outside. Thus, all the DRAMs #0 to #7 may enter into the self-refresh mode.

Thus, when a self-refresh exit command SRX is issued at time t23, all the DRAMs #0 to #7 will consequently transition from the self-refresh mode to the normal mode (IDLE).

The time span used to return the DRAMs #4 to #7 from the deep power down mode to the normal mode (time t21 to time t22) may be longer than the maximum issue cycle time (tREFI×9) of a refresh command determined by the specifications. However, in some embodiments, in a period in which the DRAMs #4 to #7 perform a returning operation from the deep power down mode to the normal mode, the other DRAMs #0 to #3 enter into the self-refresh mode. At least for this reason, neither a refresh command nor auto-refresh command are issued from the outside of the semiconductor chip during a period when the DRAMs #4 to #7 is performing the returning operation. At least for this reason, even though a long time may be taken to return from the deep power down mode, the data in the other DRAMs #0 to #3 may not be lost.

Figure 13:
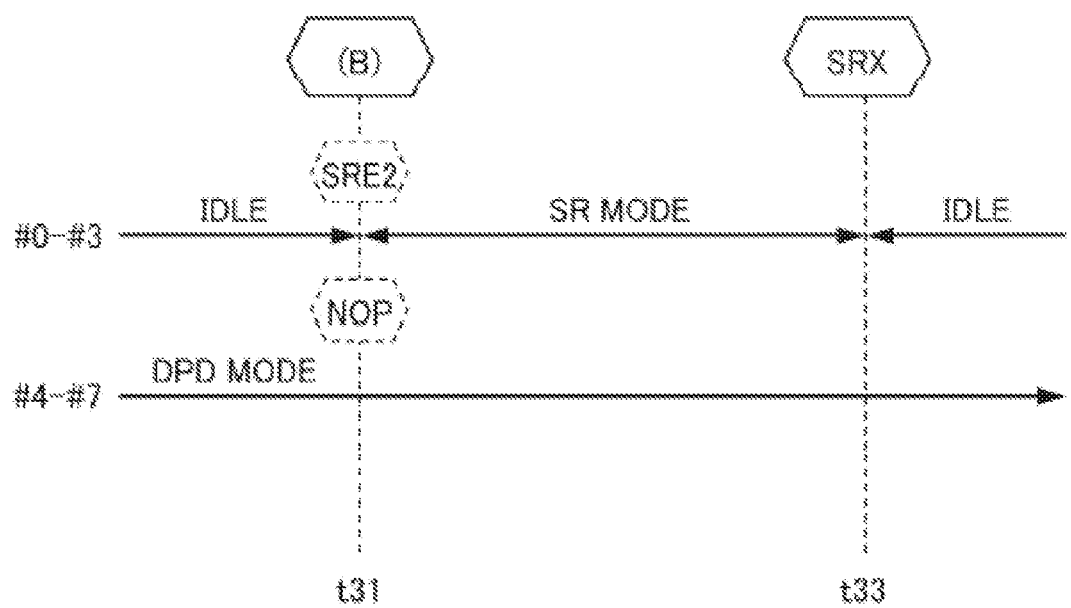
FIG. 13 is a timing chart explaining an operation performed when a command signal CMD having the second input pattern (B) as shown in FIG. 10 is input, in case that DRAMs are operated in different operation modes.

FIG. 13 is a timing chart explaining an operation performed when a command signal CMD having the second input pattern (B) as shown in FIG. 10 is input when DRAMs having different operation modes are mixed.

In some embodiments as shown in FIG. 13, the DRAMs #0 to #3 may operate in the normal mode (IDLE), and the DRAMs #4 to #7 may have entered into the deep power down mode (DPD MODE). In this state, a command having the second input pattern (B) is issued at time t31. As described above, the second input pattern (B) is interpreted as the second self-refresh entry command SRE2 in each of the DRAMs #0 to #3 in an IDLE state, and the second input pattern (B) is interpreted as the no-operation command NOP in each of the DRAMs #4 to #7.

Thus, the DRAMs #0 to #3 in the IDLE state may enter to the self-refresh mode at time t31. On the other hand, the DRAMs #4 to #7 may still continuously be kept in the deep power down mode (DPD MODE).

Thereafter, when the self-refresh exit command SRX is issued at time t33, the DRAMs #0 to #3 will return from the self-refresh mode to the normal mode (IDLE).

As described above, a command CMD having the second input pattern (B) is input, the DRAMs #0 to #3 can enter into the self-refresh mode while the DRAMs #4 to #7 are still kept in the deep power down mode.

As described above, according to some embodiments, the command signal CMD having the first input pattern (A) is input to cause the DRAMs #0 to #3 operated in the normal mode to enter into the self-refresh mode, and to cause the DRAMs #4 to #7 enter into the deep power down mode to return from the deep power down mode and, thereafter, to automatically enter into the self-refresh mode. In this manner, even though a long time may be taken to return from the deep power down mode, data in the DRAMs #0 to #3 operated in the normal mode may not be lost.

CONCLUSION

In some embodiments, a device includes a plurality of memory cells, an access circuit configured to perform a data read operation, a data write operation and a data refresh operation on the memory cells, the access circuit taking a selected one of a first mode that is ready to perform and a second mode that is not ready to perform, and a judgment circuit configured to respond to first command information and cause, when the access circuit is in the first mode, the access circuit to perform the data refresh operation and cause, when the access circuit is in the second mode, the access circuit to take procedures for exiting from the second mode and then to perform the refresh operation.

In some embodiments, a system includes a memory controller configured to issue a plurality of commands that includes a read command, a write command and a refresh command, the refresh command including first command information or second command information, and a plurality of memory devices configured to receive the commands in common from the memory controller. Each of the plurality of memory devices includes a plurality of memory cells, an access circuit configured to perform a data read operation, a data write operation and a data refresh operation on the memory cells in response to the commands from the memory controller, the access circuit taking a selected one of a first mode that is ready to perform and a second mode that is not ready to perform, and a judgment circuit configured to respond to the first command information and cause, when the access circuit is in the first mode, the access circuit to perform the data refresh operation and cause, when the access circuit is in the second mode, the access circuit to take procedures for exiting from the second mode and then to perform the refresh operation.

In some embodiments, a method includes bringing a first memory device into a first mode in which the first memory device is ready to operate and a second memory device into a second mode in which the second memory device is not ready to operate, each of the first and second memory devices comprising at least one memory cell, and supplying first command information in common to the first and second memory devices so that the first memory device is caused to perform a data refresh operation on the memory cell and the second memory device is caused to exit from the second mode and then to perform a data refresh operation on the memory cell.

According to some embodiments, the device can perform different operations depending on first or second mode in which the device is, in response to a command.

In some embodiments, since the system includes a memory controller configured to issue a command including a read command, a write command, and a refresh command, the refresh command including first command information or second command information, the device can perform the different operations based on the first or second command information.

Furthermore, in case that the first memory device and the second memory device are operated by a same chip select signal, a per addressability can cause the second memory unit to be set into the second mode while can cause the first memory unit to perform a data read operation, a data write operation or a data refresh operation on a memory cell therein via a first mode. The method can cause the first memory unit to perform the data refresh operation while cause the second memory unit to exit from the second mode and then to perform the refresh operation by responding to first command information.

Although various embodiments have been described above, the disclosure is not limited to these embodiments. It will be appreciated by those of ordinary skill in the art that various changes in form and details may be made therein without departing from the scope of the present disclosure, as defined by the claims.

What is claimed is:

1. A device comprising:
a plurality of terminals supplied with command information from an outside of the device, the command information comprising a plurality of bits respectively corresponding to the plurality of terminals, and the plurality of bits being configured to take a plurality of combinations in a logic level to designate a plurality of commands; and
an internal circuit coupled to the plurality of terminals to receive the command information, the internal circuit being configured to perform a first operation responsive to a first one of the plurality of combinations in the logic level when the internal circuit is in a first mode and to perform a second operation responsive to the first one of the plurality of combinations in the logic level when the internal circuit is in a second mode, the first operation being different from the second operation, and the first mode being different from the second mode.

2. The device as claimed in claim 1, wherein the second operation comprises exiting from the second mode.

3. The device as claimed in claim 2, wherein the internal circuit is configured to perform the first operation after exiting from the second mode.

4. The device as claimed in claim 1, wherein the internal circuit comprises a memory cell array, wherein the first operation comprises refreshing at least a part of the memory cell array, and wherein the second operation comprises exiting from the second mode.

5. The device as claimed in claim 4, the internal circuit is configured to perform the first operation after exiting from the second mode.

6. The device as claimed in claim 5, wherein the first mode is being ready to access the memory cell array, and the second mode is being in a power down mode.

7. The device as claimed in claim 3, wherein the internal circuit is configured to perform the first operation without receiving new command information at the plurality of terminals.

8. The device as claimed in claim 5, wherein the internal circuit is configured to perform the first operation without receiving new command information at the plurality of terminals.

9. The device as claimed in claim 1, wherein the second operation comprises a first part and a second part, wherein the first part is to exit from the second mode, and wherein the second part is to cause the internal circuit to perform the first operation.

10. A device comprising:
a terminal configured to receive a command from an outside of the device; and
an internal circuit configured to produce a first entry command based on the command and a first mode, and to produce a second entry command based on the command and a second mode, the second mode being different from the first mode, and the first entry command being different from the second entry command, wherein the first mode is a deep power down mode, wherein the first entry command is a first type of a self-refresh command, and wherein the command is a combination of a clock enable signal and a chip select signal.

11. The device as claimed in claim 10, further comprising:
a memory cell array; and
a control circuit configured to control an operation of the memory cell array, wherein the first and second modes are to indicate a status of the operation of the memory cell array.

12. A device comprising:
a terminal configured to receive a command from an outside of the device; and
an internal circuit configured to produce a first entry command based on the command and a first mode, and to produce a second entry command based on the command and a second mode, the second mode being different from the first mode, and the first entry command being different from the second entry command, wherein the first mode is a deep power down mode, wherein the first entry command is a first type of a self-refresh command, wherein the command includes a first signal and a second signal, and wherein the internal circuit is configured to produce the first entry command when a period between a transition of the first signal and a transition of the second signal is a first period, and wherein the internal circuit is configured not to produce the first entry command when the period between the transition of the first signal and the transition of the second signal is a second period different from the first period.

13. A device comprising:
a terminal configured to receive a command from an outside of the device; and
an internal circuit configured to produce a first entry command based on the command and a first mode, and to produce a second entry command based on the command and a second mode, the second mode being different from the first mode, and the first entry command being different from the second entry command, wherein the first mode is a deep power down mode, wherein the first entry command is a first type of a self-refresh command, wherein the second mode is an idle mode, and wherein the second entry command is a second type of the self-refresh command.

14. A system comprising:
first and second semiconductor chips, each of the first and second semiconductor chips comprising a plurality of terminals;
a plurality of command signal lines each commonly coupled to the plurality of terminals of a corresponding one of the first and second semiconductor chips; and
first and second internal circuits each provided in a corresponding one of the first and second semiconductor chips to receive a command commonly transferred from the plurality of command signal lines through the terminals of the respective semiconductor chips, each of the first and second internal circuits being configured to produce a first entry command based on the command and a first mode, and to produce a second entry command based on the command and a second mode different from the first mode, and the first entry command being different from the second entry command.

15. The system as claimed in claim 14, wherein the first semiconductor chip is operated in the first mode, and the second semiconductor chip is operated in the second mode, wherein the first and second internal circuits are configured to receive the same command so that the first internal circuit is to produce the first entry command and the second internal circuit is to produce the second entry command.

16. The system as claimed in claim 14, wherein the first mode comprises an idle mode.

17. The system as claimed in claim 16, wherein the second mode comprises a deep power down mode.

18. The system as claimed in claim 14, wherein the first entry command comprises a command for a self-refresh operation.

19. The system as claimed in claim 18, wherein the second entry command comprises a command for exiting the deep power down mode.

20. The system as claimed in claim 14, further comprising a control circuit configured to perform per DRAM addressability function to allow the first semiconductor chip to be operated in the first mode, and to allow the second semiconductor chip to be operated in the second mode.

* * * * *